US007069178B2

(12) United States Patent
Cui et al.

(10) Patent No.: US 7,069,178 B2
(45) Date of Patent: Jun. 27, 2006

(54) METHOD OF PREDICTING QUIESCENT CURRENT VARIATION OF AN INTEGRATED CIRCUIT DIE FROM A PROCESS MONITOR DERATING FACTOR

(75) Inventors: Qian Cui, San Jose, CA (US); Sandeep Bhutani, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/955,168

(22) Filed: Sep. 29, 2004

(65) Prior Publication Data

US 2006/0074589 A1    Apr. 6, 2006

(51) Int. Cl.
*G06F 3/01*     (2006.01)

(52) U.S. Cl. ...................... 702/179; 702/182; 702/183; 702/186

(58) Field of Classification Search ................. 702/57, 702/84, 89, 118, 119, 108, 183, 117, 179, 702/182, 186; 324/765; 365/201; 703/14; 714/738, 741

See application file for complete search history.

(56) References Cited

U.S. PATENT DOCUMENTS 5,944,847 A * 8/1999 Sanada ................. 714/741

OTHER PUBLICATIONS

Johnson et al., Models and Algorithms for Bounds on Leakage in CMOS Circuits, Jun. 1999, IEEE Transactions on Computer-Aided Design of Integrated Circuits and Systems, vol. 18 No. 6, pp. 714-725.*
Rajsuman R., Iddq Testing for CMOS VLSI, Apr. 2000, Proceedings of the IEEE, vol. 88 No. 4, pp. 544-566.*
Sabade et al., Neighbor Current Ratio (NCR): A New Metric for Iddq Data Analysis, 2002, IEEE Computer Society, 9 pages.*
Mao et al., Quiescent Current Testing Methodology for Detecting Leakage Faults, 90, IEEE, pp. 280-283.*

* cited by examiner

*Primary Examiner*—Marc S. Hoff
*Assistant Examiner*—Felix Suarez
(74) *Attorney, Agent, or Firm*—Fitch, Even, Tabin & Flannery (57) ABSTRACT

In exemplary embodiments, a method and computer program product for predicting quiescent current variation of an integrated circuit die include steps of: (a) receiving as input a value of a derating factor from a process monitor cell on an integrated circuit die and an on-chip variation of the derating factor; (b) constructing a curve fitting formula for estimating a quiescent current of the integrated circuit die as a function of the derating factor; (c) calculating minimum and maximum values of the quiescent current from the curve fitting formula, the value of the derating factor from the process monitor cell, and the on-chip variation of the derating factor to generate an estimate of minimum and maximum values for the quiescent current; and (d) generating as output the estimated minimum and maximum values of the quiescent current.

23 Claims, 8 Drawing Sheets

METHOD OF PREDICTING QUIESCENT CURRENT VARIATION OF AN INTEGRATED CIRCUIT DIE FROM A PROCESS MONITOR DERATING FACTOR

BACKGROUND OF THE INVENTION

1. Field of the Invention

The method of predicting quiescent current variation of an integrated circuit die from a derating factor of a process monitor disclosed herein is directed to testing and screening of integrated circuit die. More specifically, but without limitation thereto, this method is directed to detecting defective die by comparing the measured quiescent current of a die to a selected range of quiescent current values predicted for a defect free die.

2. Description of Related Art

Quiescent current testing has proven to be an effective approach to screening defects during manufacturing and testing of semiconductor devices. As semiconductor technology progresses toward reduced transistor size, single limit quiescent current (IDDQ) testing becomes less effective due to large variances in quiescent current resulting from process shifts during manufacturing. The large variances in quiescent current are likely to result in screening good die as defective or in passing defective die.

SUMMARY OF THE INVENTION

In exemplary embodiments, a method and computer program product for predicting quiescent current variation of an integrated circuit die include steps of:

(a) receiving as input a value of a derating factor from a process monitor cell on an integrated circuit die and an on-chip variation of the derating factor;

(b) constructing a curve fitting formula for estimating a quiescent current of the integrated circuit die as a function of the derating factor;

(c) calculating minimum and maximum values of the quiescent current from the curve fitting formula, the value of the derating factor from the process monitor cell, and the on-chip variation of the derating factor to generate an estimate of minimum and maximum values for the quiescent current; and (d) generating as output the estimated minimum and maximum values of the quiescent current.

In another embodiment, a computer program product includes a medium for embodying a computer program for input to a computer and a computer program embodied in the medium for causing the computer to perform steps of:

(a) receiving as input an integrated circuit design, values of quiescent current of each cell in the integrated circuit design for multiple process corners of a derating factor, a value of the derating factor from a process monitor cell, and an on-chip variation of the derating factor;

(b) generating a design statistic file that includes a name and quantity of each cell in the integrated circuit design;

(c) constructing a curve fitting formula for the quiescent current of each cell named in the design statistic file as a function of the derating factor;

(d) calculating a minimum and a maximum value of the quiescent current for each cell named in the design statistic file from the curve fitting formula from the value of the derating factor from the process monitor cell and the on-chip variation of the derating factor;

(e) multiplying the minimum and maximum values of quiescent current calculated for each cell named in the design statistic file by a corresponding quantity of the cell in the design statistic file to generate a minimum product and a maximum product respectively for the cell;

(f) summing the minimum product of each cell to generate an estimated minimum quiescent current of the integrated circuit design;

(g) summing the maximum product of each cell to generate an estimated maximum quiescent current of the integrated circuit design; and (h) generating as output the estimated minimum and maximum values of quiescent current of the integrated circuit design as a function of the derating factor.

BRIEF DESCRIPTION OF THE DRAWINGS

The embodiments described herein are illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments.

DESCRIPTION OF THE ILLUSTRATED EMBODIMENTS

A quiescent current test measures leakage current, or current dissipation, for an entire integrated circuit die to detect potential faults. In previous methods of screening defective integrated circuit die, the quiescent current corresponding to the speed performance of a semiconductor device (device delay vs. IDDQ) or the quiescent current for different logic states of the semiconductor device (delta IDDQ) is used to predict the quiescent current limit for a defect free device.

The embodiments described below provide a method of screening defective die using a derating factor of a process monitor cell. A process monitor cell is a special cell that is located at a corner of an integrated circuit die to monitor process parameters. After the die is fabricated, the cell delay of the process monitor cell may be measured to calculate a process derating factor. The process derating factor is the ratio of the speed measured for the process monitor cell and a nominal value. For example, a process derating factor of 1.0 is representative of a nominal process, a process derating factor of 0.8 is representative of a fast process, and a process derating factor of 1.2 is representative of a slow process.

Figure 1:
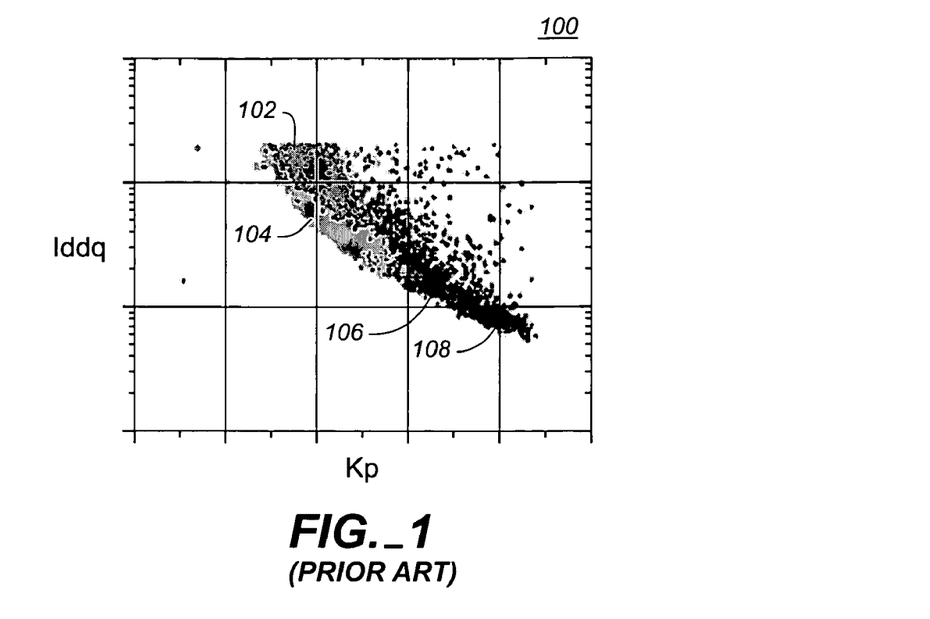
FIG. 1 illustrates a scatter plot of quiescent current variation vs. the process derating factor according to the prior art.

FIG. 1 illustrates a scatter plot 100 of quiescent current variation vs. the process derating factor of a process monitor cell according to the prior art. Shown in FIG. 1 are quiescent current data points for a fast N-transistor process and a fast P-transistor process 102, quiescent current data points for a fast N-transistor process and a slow P-transistor process 104, quiescent current data points for a nominal N-transistor process and a nominal P-transistor process 106, and quiescent current data points for a slow N-transistor process and a slow P-transistor process 108.

As may be appreciated from the scatter plot 100, the quiescent current may vary by a factor of two for different die having the same process derating factor. On the other hand, the quiescent current may vary by a factor from 50 to 100 when the process derating factor has a value that ranges from 0.8 for a fast process to 1.2 for a slow process. In addition to the process derating factor, quiescent current may also vary as a function of supply voltage and operating temperature.

In one embodiment, a method of predicting quiescent current variation of an integrated circuit die from a process monitor derating factor includes steps of:

(a) receiving as input a value of a derating factor from a process monitor cell on an integrated circuit die and an on-chip variation of the derating factor;

(b) constructing a curve fitting formula for estimating a quiescent current of the integrated circuit die as a function of the derating factor;

(c) calculating minimum and maximum values of the quiescent current from the curve fitting formula, the value of the derating factor from the process monitor cell, and the on-chip variation of the derating factor to generate an estimate of minimum and maximum values of the quiescent current; and (d) generating as output the estimated minimum and maximum values of the quiescent current.

A formula for quiescent current of a cell as an exponential function of the process derating factor is given by:

$$Iddq = Iddq\_nom * A * \exp(-B*Kp) \quad (1)$$

wherein Iddq is the quiescent current, A and B are parameters calculated below, Iddq_nom is a nominal value of quiescent current of the integrated circuit die, and Kp is the process derating factor.

The parameters A and B may be calculated by an exponential curve fit using values of the process derating factor and corresponding values of the quiescent current for fast and slow processes from the following simultaneous equations:

$$Iddq\_slow = Iddq\_nom * A * \exp(-B*Kp\_slow) \quad (2)$$

$$Iddq\_fast = Iddq\_nom * A * \exp(-B*Kp\_fast) \quad (3)$$

wherein Iddq_slow is an average quiescent current of a defect free die having a process derating factor corresponding to a slow process, Kp_slow is the value of the process derating factor corresponding to the slow process, Iddq_fast is an average quiescent current of a defect free die having a process derating factor corresponding to a fast process, and Kp_fast is the value of the process derating factor corresponding to the fast process. Subtracting equation (2) from equation (3) gives:

$$B = (\ln(Iddq\_slow) - \ln(Iddq\_fast))/(Kp\_fast - Kp\_slow) \quad (4)$$

The other parameter A may be found from the value of the quiescent current corresponding to a nominal value of the process derating factor from $$Iddq\_nom = Iddq\_nom * A * \exp(-B*Kp\_nom) \quad (5)$$

Since Kp_nom=1, $$A = \exp(B) \quad (6)$$

Equations (4) and (6) may be used to derive the parameters A and B for equation (1) for Iddq as a function of the process derating factor for a given cell.

Assuming a certain amount of on-chip variation in the value of the process derating factor Kp from cell to cell on the chip, for example, ±4 percent, and a process derating factor that has a normal distribution of values, then the on-chip variation is equal to the variance, or sigma, of the distribution.

Figure 2:
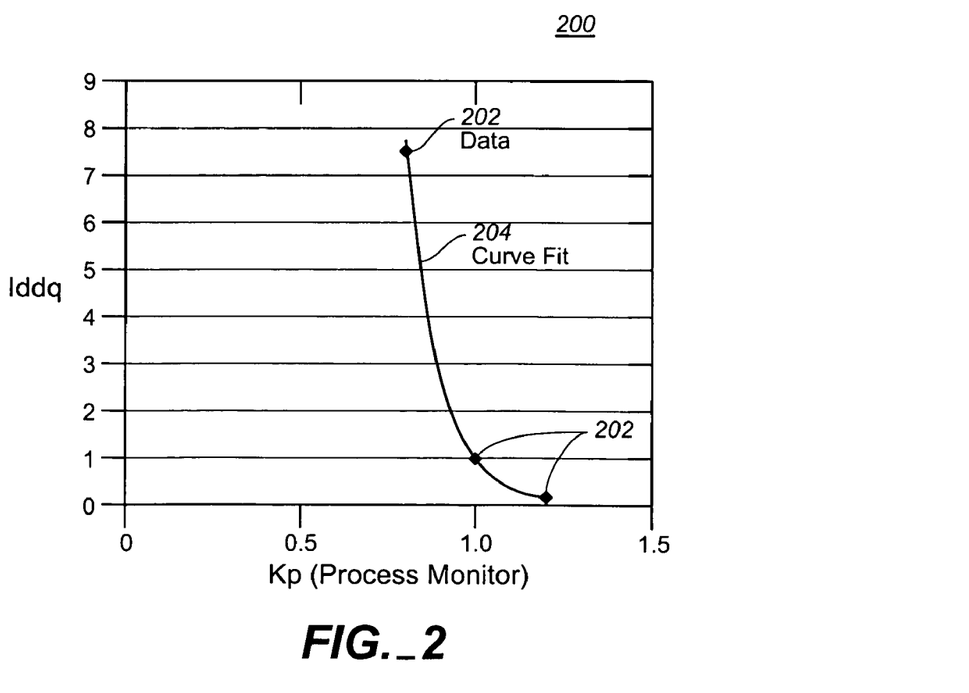
FIG. 2 illustrates a plot of a curve fitting formula for quiescent current as an exponential function of the process derating factor for an inverter cell.

FIG. 2 illustrates a plot 200 of a curve fitting formula for quiescent current as an exponential function of the process derating factor for an inverter cell. Shown in FIG. 2 are data points 202 and a curve fit 204. The data points 202 are representative of the values of the process derating factor from a process monitor cell and the corresponding values of quiescent current of the inverter cell. The data points 202 may be determined, for example, by simulation of the integrated circuit design using readily available simulation programs such as SPICE. Alternatively, the data points 202 may be measured from a sample die lot and averaged according to well known techniques.

Substituting the values found for the parameters A and B from the inverter example of FIG. 2 in equation (1) gives the curve fitting formula 204:

$$Iddq = 9.53859 * 10^{-6} * 36002 * \exp(-10.555 * Kp) \quad (7)$$

A simulation was performed for a chip having one million inverters that assumes a process derating factor of 0.9 for the process monitor cell and an on-chip variation in the process derating factor of −4 percent to +4 percent. A mean value for the process derating factor of 0.9 and a 3-sigma value of 4 percent of the process derating factor is also assumed. A random number generator was used to generate a value of the process derating factor for each of the one million inverters on the chip to simulate the impact of on-chip process variation.

Figure 3:
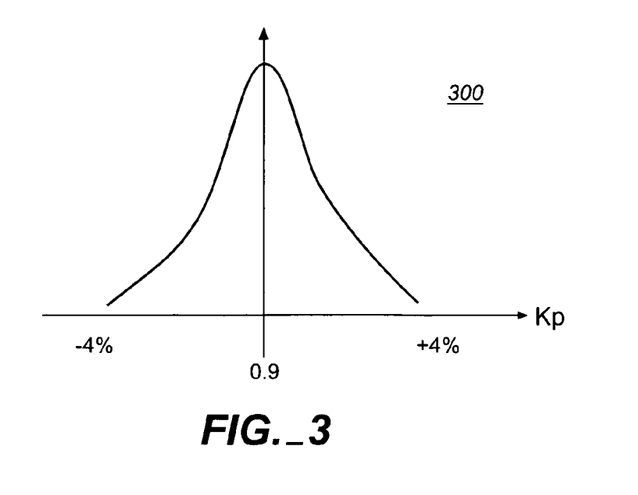
FIG. 3 illustrates a plot of a typical distribution of values for the process derating factor in which the mean value of the distribution is the same as that of the process monitor cell.

FIG. 3 illustrates a plot 300 of a typical distribution of values for the process derating factor in which the mean value of the distribution is the same as the process derating factor of the process monitor cell. In this example, 0.9 is the value of the process derating factor for the process monitor and the mean of the distribution. The 3-sigma points of the distribution are at −4 percent and +4 percent of the mean. In this example, the distribution of values for the process derating factor was generated from a simulation of one million inverters on a chip.

Figure 4:
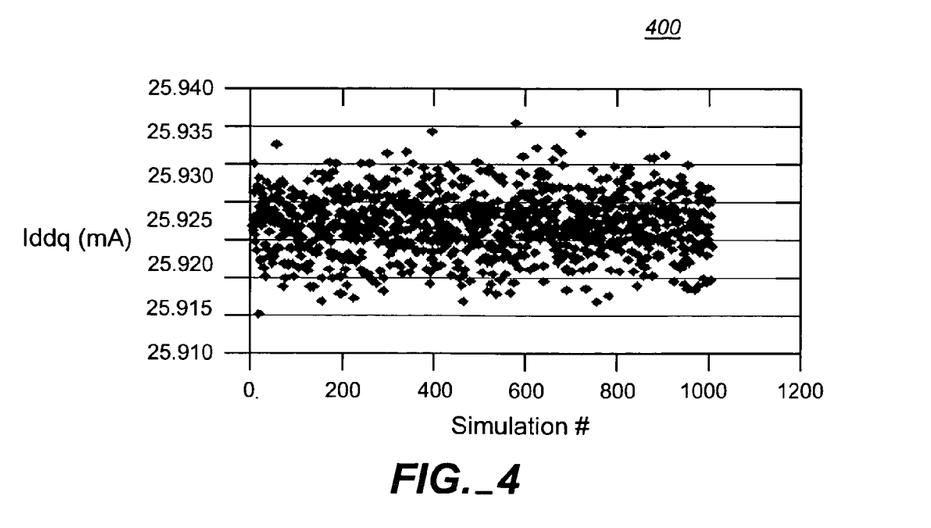
FIG. 4 illustrates a scatter plot of quiescent current values summed over the one million inverters calculated from the process derating factors plotted in FIG. 3.

FIG. 4 illustrates a scatter plot 400 of quiescent current values summed over the one million inverters calculated from the process derating factors plotted in FIG. 3. One thousand simulations were performed, and each simulation includes one million inverters on a chip. Using the process derating factor value of the process monitor cell as the mean of the distribution of values for the process derating factor for the one million inverters on the chip, the variation in quiescent current over the one thousand simulations was only about 0.2 percent.

Another simulation was performed similar to the first, however, in the second simulation, the process derating factor value of the process monitor cell is not the same as the mean of the distribution of process derating factor values for all the cells on the chip. A random number generator was used to generate one value of the process derating factor for the mean of the distribution and another value for the process derating factor of the process monitor cell based on the mean value of the distribution.

Figure 5:
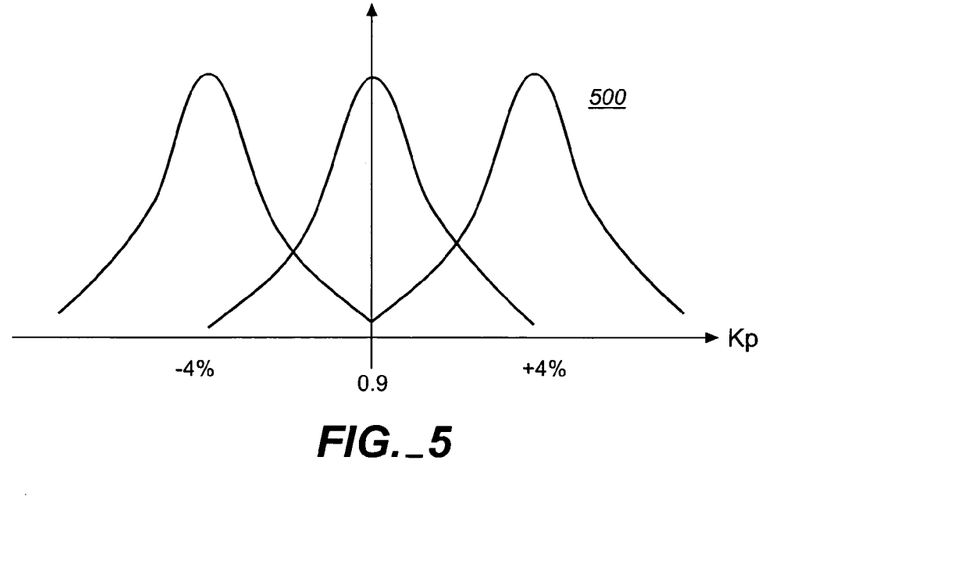
FIG. 5 illustrates a plot of a typical distribution of values for the process derating factor in which the mean value of the distribution is different from that of the process monitor cell.

FIG. 5 illustrates a plot 500 of a typical distribution of values for the process derating factor in which the mean value of the distribution is different from that of the process monitor cell. In FIG. 5, the value of the process derating factor for the process monitor has a much wider range than that of FIG. 3. The distribution of values for the process derating factor in FIG. 5 was also generated from one thousand simulations of one million inverters on a chip.

Figure 6:
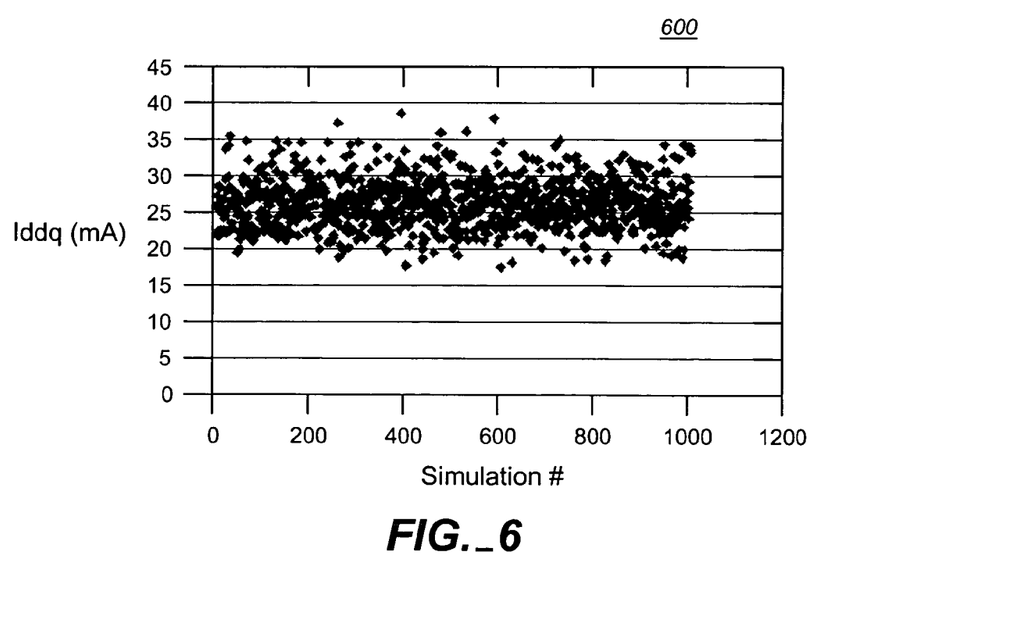
FIG. 6 illustrates a scatter plot of quiescent current values summed over the one million inverters calculated from the process derating factors plotted in FIG. 5.

FIG. 6 illustrates a scatter plot 600 of quiescent current values summed over the one million inverters calculated from the process derating factors plotted in FIG. 5. One thousand simulations were performed of one million inverters on a chip. Using the range of values for the process derating factor of the process monitor cell plotted in FIG. 5, the variation in quiescent current was about 200 percent, which is in agreement with experimental data.

Based on the results of the simulations described above, the minimum and maximum values of quiescent current may be estimated for a value of the process derating factor measured from a process monitor cell on a die for a selected on-chip variation sigma (Kp) without having to perform further simulations as follows.

Figure 7:
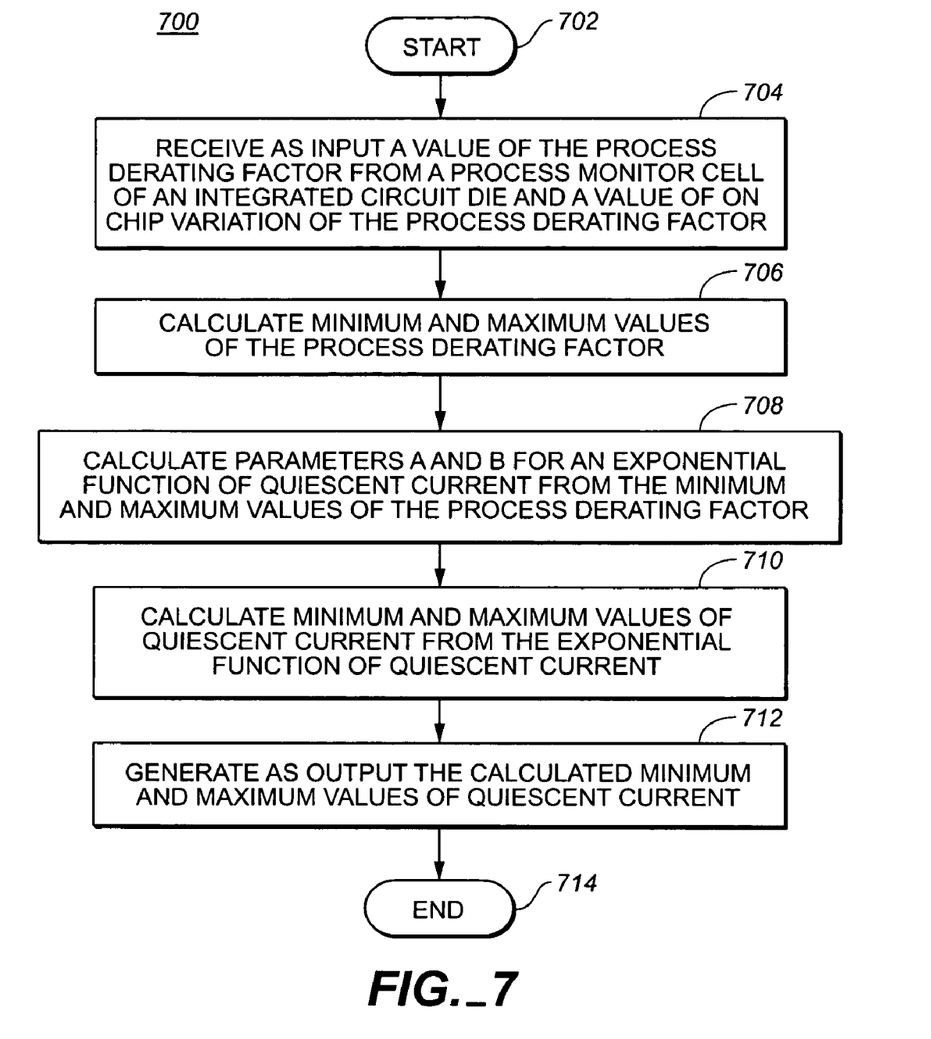
FIG. 7 illustrates a flow chart of a method of estimating quiescent current variation of an integrated circuit die from the process derating factor of a process monitor cell.

FIG. 7 illustrates a flow chart 700 of a method of estimating quiescent current variation of an integrated circuit die from the process derating factor of a process monitor cell.

Step 702 is the entry point of the flow chart 700.

In step 704, a value of the process derating factor from a process monitor cell of an integrated circuit die and a value of on-chip variation of the process derating factor are received as input. The process derating factor of the process monitor cell may be measured according to well known techniques, and the on-chip variation of the process derating factor may be found according to well known techniques from statistical design data in a cell library.

In step 706, minimum and maximum values of the process derating factor are calculated by subtracting the product of the on-chip variation of the process derating factor times the value of the process derating factor from the value of the process derating factor and adding the product of the on-chip variation of the process derating factor times the value of the process derating factor to the value of the process derating factor of the process monitor cell. For example, if the value of the process derating factor from the process monitor cell is 0.9 and the on-chip variation of the process derating factor is 4 percent, then the minimum value of the process derating factor would be $(0.9-0.04*0.9)=0.864$, and the maximum value of the process derating factor would be $(0.9+0.04*0.9)=0.936$.

In step 708, the parameters A and B for the exponential function of quiescent current of equation (1) are calculated from the minimum and maximum values of the process derating factor as described above with reference to equations (2)–(6).

In step 710, minimum and maximum values of quiescent current are calculated from the quiescent current function of equation (1).

In step 712, the calculated minimum and maximum values of quiescent current are generated as output to estimate the variation in quiescent current for the integrated circuit die.

Step 714 is the exit point of the flow chart 700.

The steps described above with regard to the flow chart 700 may also be implemented by instructions performed on a computer according to well-known programming techniques.

In another embodiment, a computer program product includes a medium for embodying a computer program for input to a computer and a computer program embodied in the medium for causing the computer to perform steps of:

(a) receiving as input a value of a derating factor from a process monitor cell on an integrated circuit die and an on-chip variation of the derating factor;

(b) constructing a curve fitting formula for estimating a quiescent current of the integrated circuit die as a function of the derating factor;

(c) calculating minimum and maximum values of the quiescent current from the curve fitting formula, the value of the derating factor, and the on-chip variation of the derating factor to generate an estimate of minimum and maximum values of the quiescent current; and (d) generating as output the estimated minimum and maximum values of the quiescent current.

Figure 8:
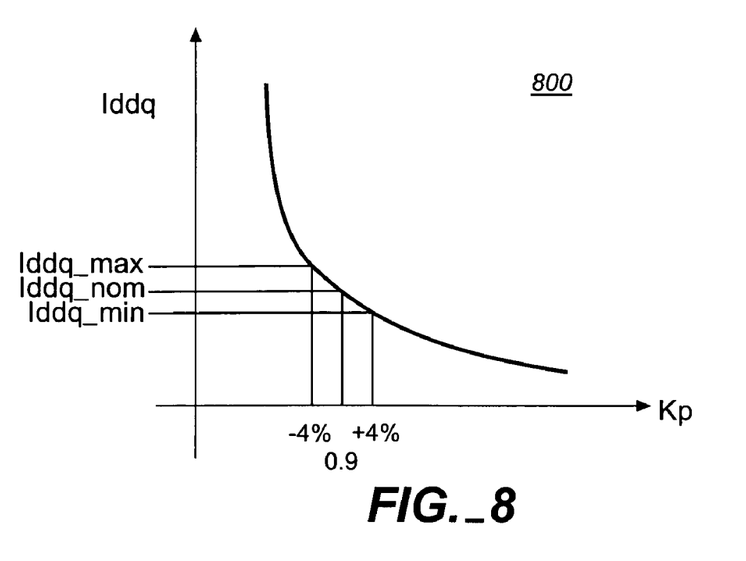
FIG. 8 illustrates a plot of an exponential function for quiescent current vs. process derating factor for estimating the minimum and maximum quiescent current according to the method of FIG. 7.

FIG. 8 illustrates a plot 800 of quiescent current vs. process derating factor for estimating the minimum and maximum quiescent current according to the method of FIG. 7. In FIG. 8, the estimate of minimum and maximum values of quiescent current are found from the minimum and maximum values of the process derating factor calculated from the value measured for process derating factor from the process monitor cell and the on-chip variation. The estimated values for the minimum and maximum values of quiescent current for a defect free die may be used to screen defective die from a production lot according to well known techniques.

Figure 9:
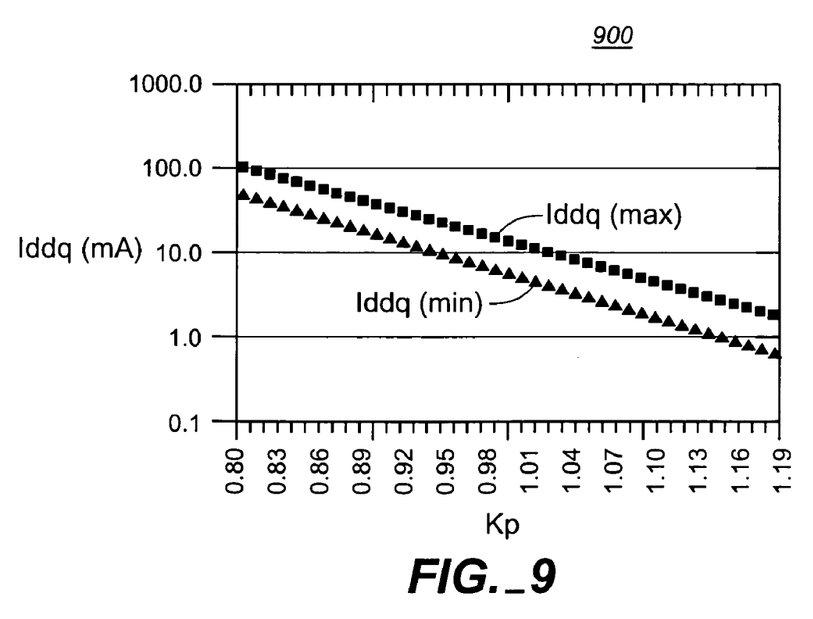
FIG. 9 illustrates a plot of minimum and maximum quiescent current vs. process derating factor for a chip containing one million inverters in a Monte Carlo simulation.

FIG. 9 illustrates a plot 900 of minimum and maximum quiescent current vs. process derating factor for a chip containing one million inverters in a Monte Carlo simulation. In the example of FIG. 2, the process monitor has a process derating factor that ranges in value from 0.8 to 1.2. The maximum/minimum values of quiescent current are approximately equal to the value of quiescent current at a corresponding value of the process derating factor plus/minus 3 sigma of the distribution of values for the process derating factor, that is, Kp+3 sigma(Kp) and Kp−3 sigma (Kp).

Using a chip variation of ±4 percent to calculate the maximum and minimum quiescent current values corresponding to values of the process derating factor ranging from 0.8 to 1.2 in equation (1) results in a ratio of quiescent current equal to about 100 between each end of the plot 900, which also is in agreement with experimental results.

Figure 10:
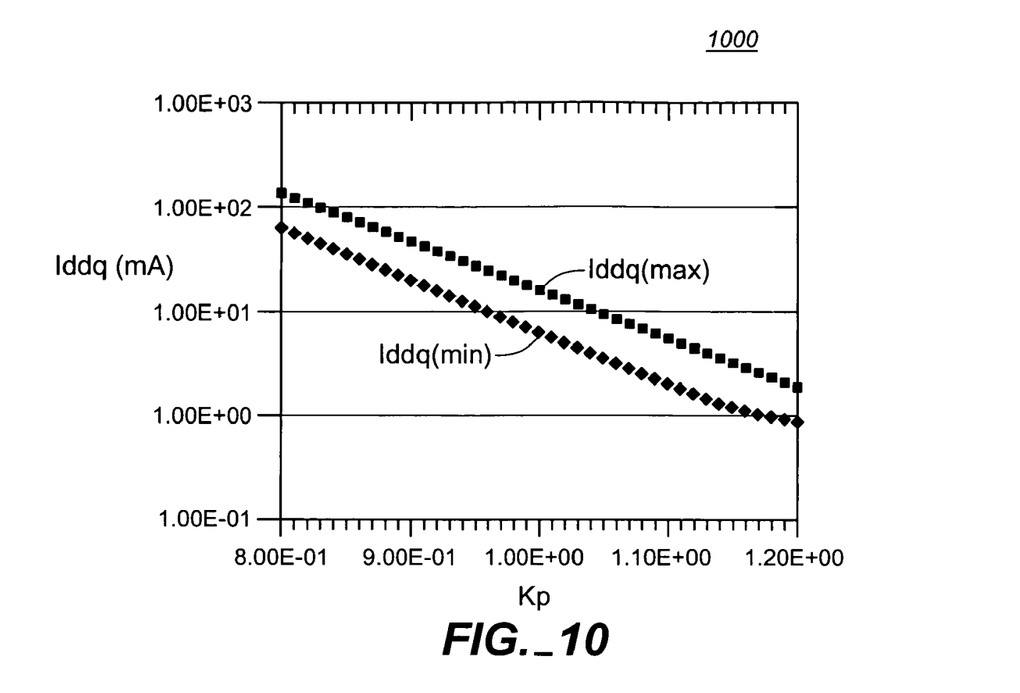
FIG. 10 illustrates a plot of minimum and maximum quiescent current vs. the process derating factor for a typical integrated circuit design excluding I/O cells.

FIG. 10 illustrates a plot 1000 of minimum and maximum quiescent current vs. process derating factor for a typical integrated circuit design.

In FIG. 10, the process monitor has a process derating factor that ranges in value from 0.8 to 1.2. Using a chip variation of ±4 percent to calculate the maximum and minimum quiescent current values corresponding to values of the process derating factor ranging from 0.8 to 1.2 in equation (1) results in a ratio of quiescent current equal to about 100 between each end of the plot 900, which also is in agreement with experimental results.

The approximation of quiescent current as a function of a process derating factor described above may also be applied to a temperature derating factor and a voltage derating factor. Using simulation programs such as HSPICE, the quiescent current is found to be a cubic function of the temperature derating factor and a linear function of the voltage derating factor.

The method of FIG. 7 may also be used to estimate quiescent current variation as a function of a temperature derating factor and a voltage derating factor as follows.

Figure 11:
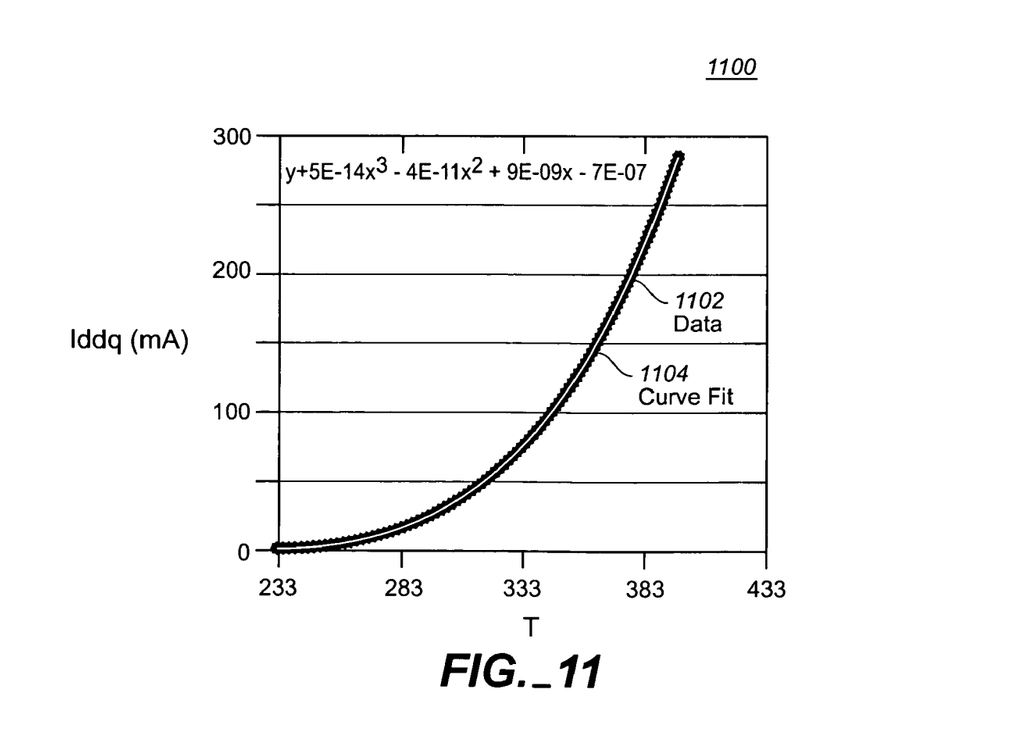
FIG. 11 illustrates a plot of a curve fitting formula for quiescent current as a cubic function of a temperature derating factor.

FIG. 11 illustrates a plot 1100 of a curve fitting formula for quiescent current as a cubic function of a temperature derating factor. Shown in FIG. 11 are data points 1102 and a curve fitting formula 1104.

The quiescent current has a range from about 0 to 300 nanoamperes that varies as a cubic function of the temperature over a range from about 233 degrees K to 400 degrees K. The equation for the curve fitting formula 1104 may be derived from the data points 1102 according to well known techniques.

Figure 12:
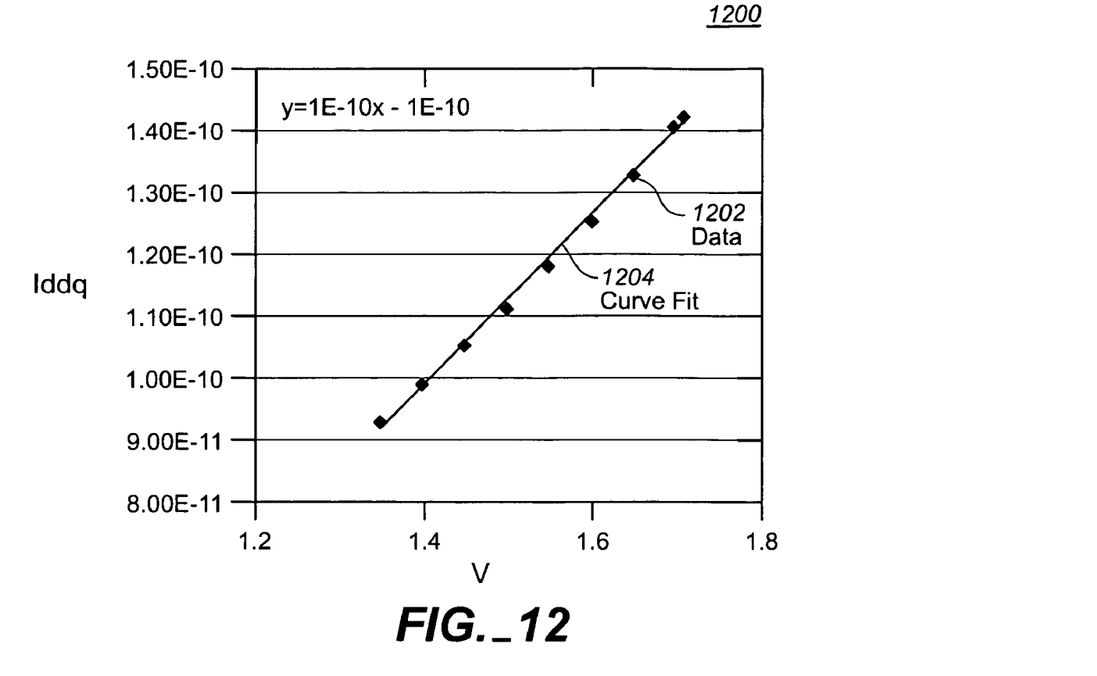
FIG. 12 illustrates a plot of a curve fitting formula for quiescent current as a linear function of a voltage derating factor.

FIG. 12 illustrates a plot 1200 of a curve fitting formula for quiescent current as a linear function of a voltage derating factor. Shown in FIG. 12 are data points 1202 and a curve fitting formula 1204.

In FIG. 12, the quiescent current has a range from about 90 picoamperes to 140 picoamperes that varies as a linear function of the supply voltage Vdd over a range of Vdd−10 percent of Vdd to Vdd+10 percent of Vdd. The equation for the curve fitting formula 1204 may be derived from the data points 1202 according to well known techniques.

Figure 13:
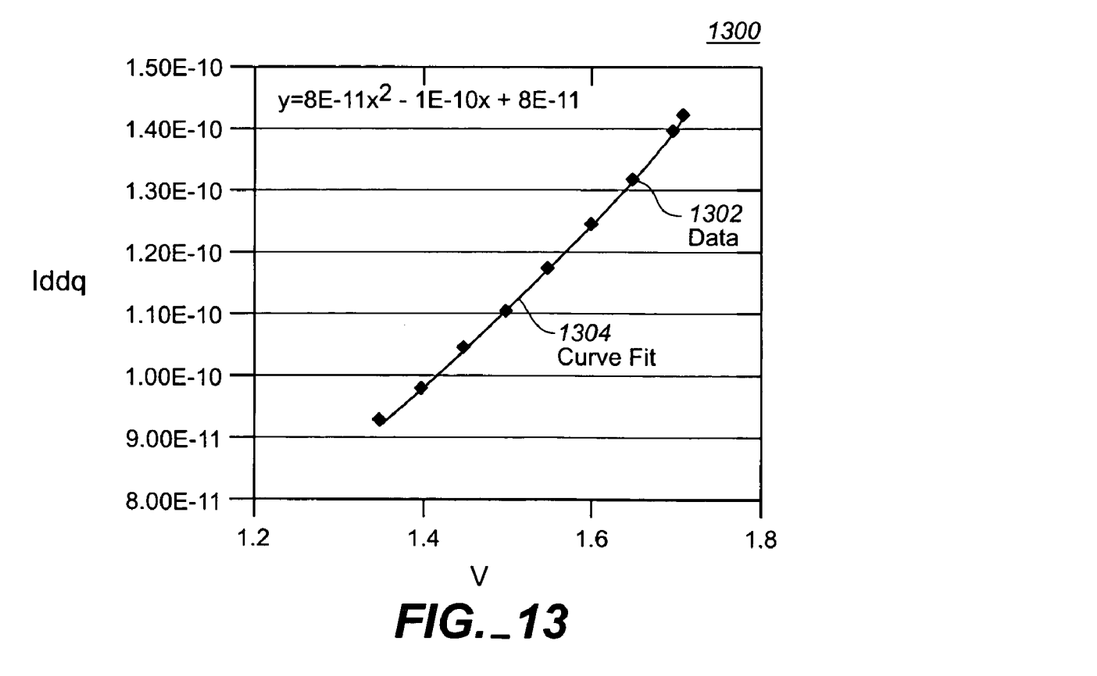
FIG. 13 illustrates a plot of a curve fitting formula for quiescent current as a quadratic function of a voltage derating factor.

FIG. 13 illustrates a plot 1300 of a curve fitting formula for quiescent current as a quadratic function of a voltage derating factor. Shown in FIG. 13 are data points 1302 and a curve fitting formula 1304.

In FIG. 13, the curve fitting formula 1304 provides an even better fit to the quiescent current data points 1302 than the curve fitting formula 1204. The equation for the curve fitting formula 1304 may be derived from the data points 1302 according to well known techniques.

The process derating factor, the temperature derating factor, and the voltage derating factor may all be used in conjunction with the process monitor cell to estimate variation of quiescent current to screen defective die as follows.

Figure 14:
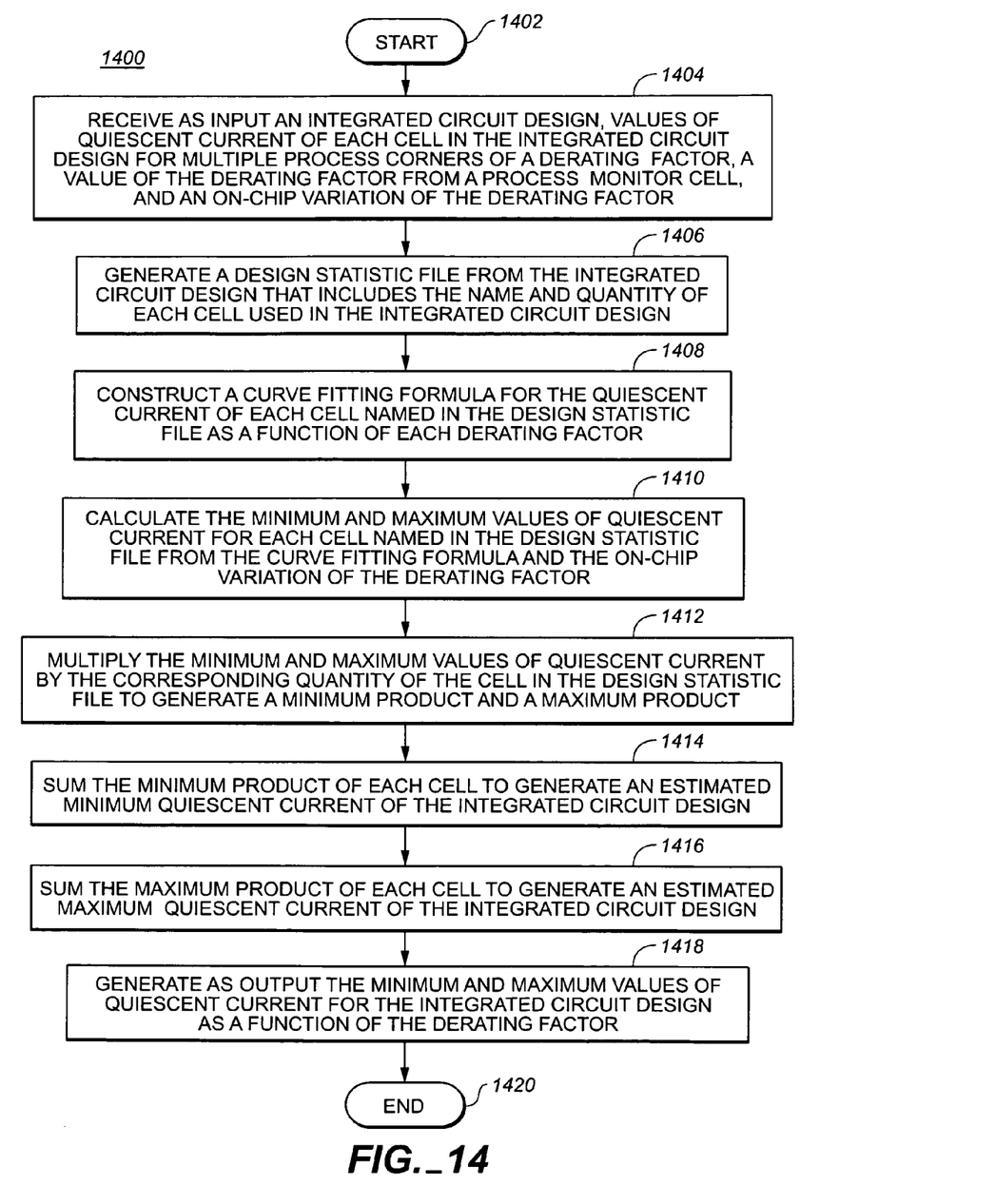
FIG. 14 illustrates a flow chart for a method of estimating minimum and maximum values of quiescent current of an integrated circuit design.

FIG. 14 illustrates a flow chart 1400 for a method of estimating minimum and maximum quiescent current of an integrated circuit design.

Step 1402 is the entry point of the flow chart 1400.

In step 1404, an integrated circuit design, values of quiescent current of each cell in the integrated circuit design for multiple process corners of a derating factor, a value of the derating factor from a process monitor cell, and an on-chip variation of the derating factor are received as input.

The integrated circuit design may be, for example, a netlist. The values of quiescent current of each cell in the integrated circuit design for multiple process corners of a derating factor may be found, for example, by a commercially available computer program such as SPICE for nominal, minimum, and maximum values of process speed, operating temperature, and supply voltage. These values are generally available from a technical cell library generated by the simulation model. The process derating factor value and its on-chip variation, an operating temperature value and its variation, and a supply voltage and its variation may be provided, for example, by a user input file.

In step 1406, a design statistic file is generated from the integrated circuit design that includes the name and quantity of each cell used in the integrated circuit design. For example, the design statistic file may list 100 AND gates and 10 NOR gates.

Steps 1408 through 1418 are performed for each cell name in the design statistic file.

In step 1408, a curve fitting formula for the quiescent current of each cell named in the design statistic file as a function of each derating factor is constructed as described above.

In step 1410, a minimum and a maximum value of the quiescent current for each cell named in the design statistic file is calculated from the curve fitting formula from the value of the derating factor from the process monitor cell and the on-chip variation of the derating factor. For example, if the value of the process derating factor is 0.9 and the on-chip variation is ±4 percent, then the value of the process derating factor used to calculate the minimum value of the quiescent current would be (0.9−0.04*0.9)=0.864, and the value of the process derating factor used to calculate the maximum value of the quiescent current would be (0.9+0.04*0.9)=0.936.

In step 1412, the minimum and maximum values of quiescent current calculated for each cell named in the design statistic file are multiplied by the corresponding quantity of the cell in the design statistic file to generate a minimum product and a maximum product respectively for the cell. For example, if there are 100 AND gates and 10 OR gates in the integrated circuit design, then the minimum and maximum values of quiescent current found for an AND gate as a function of each derating factor would be multiplied by 100 to generate the minimum product and the maximum product respectively for the AND cells, and the minimum and maximum values of quiescent current found for an OR gate as a function of each derating factor would be multiplied by 10 to generate the minimum product and the maximum product respectively for the OR cells.

In step 1414, the minimum product of each cell is summed to generate an estimated minimum quiescent current of the integrated circuit design. For example, the minimum product for the 100 AND cells would be added to the minimum product of the 10 OR cells to generate the estimated minimum quiescent current.

In step 1416, the maximum product of each cell is summed to generate an estimated maximum quiescent current of the integrated circuit design. For example, the maximum product for the 100 AND cells would be added to the maximum product of the 10 OR cells to generate the estimated maximum quiescent current.

In step 1418, the estimated minimum and maximum values of quiescent current of the integrated circuit design as a function of the derating factor are generated as output.

Step 1420 is the exit point of the flow chart 1400.

The process derating factor may be, for example, a process derating factor, a temperature derating factor, or a voltage derating factor, and the curve fitting formula may be, for example, an exponential function, a cubic function, a linear function, or a quadratic function.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow chart 1400 may also be implemented by instructions performed on a computer according to well-known programming techniques.

In another embodiment, a computer program product includes a medium for embodying a computer program for input to a computer and a computer program embodied in the medium for causing the computer to perform steps of:

(a) receiving as input an integrated circuit design, values of quiescent current of each cell in the integrated circuit design for multiple process corners of a derating factor, a value of the derating factor from a process monitor cell, and an on-chip variation of the derating factor;

(b) generating a design statistic file that includes a name and quantity of each cell in the integrated circuit design;

(c) constructing a curve fitting formula for the quiescent current of each cell named in the design statistic file as a function of the derating factor;

(d) calculating a minimum and a maximum value of the quiescent current for each cell named in the design statistic file from the curve fitting formula from the value of the derating factor from the process monitor cell and the on-chip variation of the derating factor;

(e) multiplying the minimum and maximum values of quiescent current calculated for each cell named in the design statistic file by a corresponding quantity of the cell in the design statistic file to generate a minimum product and a maximum product respectively for the cell;

(f) summing the minimum product of each cell to generate an estimated minimum quiescent current of the integrated circuit design;

(g) summing the maximum product of each cell to generate an estimated maximum quiescent current of the integrated circuit design; and (h) generating as output the estimated minimum and maximum values of quiescent current of the integrated circuit design as a function of the derating factor.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
(a) receiving as input a value of a aerating factor from a process monitor cell on an integrated circuit die and an on-chip variation of the derating factor;

(b) constructing a curve fitting formula for estimating a quiescent current of the integrated circuit die as a function of the derating factor;

(c) calculating minimum and maximum values of the quiescent current from the curve fitting formula, the value of the derating factor, and the on-chip variation of the derating factor to generate an estimate of minimum and maximum values of the quiescent current; and (d) generating as output the estimated minimum and maximum values of the quiescent current.

2. The method of claim 1 wherein the derating factor is a process derating factor and the curve fitting formula is constructed as an exponential function substantially according to $$Iddq = Iddq\_nom * A * \exp(-B * Kp)$$

wherein Iddq is the quiescent current, A and B are calculated parameters, Iddq_nom is a nominal value of the quiescent current, and Kp is the process derating factor.

3. The method of claim 2 wherein the parameter B is calculated substantially according to $$B = (\ln(Iddq\_slow) - \ln(Iddq\_fast))/(Kp\_fast - Kp\_slow)$$

wherein Iddq_slow is a quiescent current corresponding to a slow process, Kp_slow is a process derating factor corresponding to the slow process, Iddq_fast is a quiescent current corresponding to a fast process, and Kp_fast is a process derating factor corresponding to the fast process.

4. The method of claim 3 wherein the parameter A is calculated substantially according to $$A = \exp(B).$$

5. The method of claim 4 wherein step (c) comprises calculating the maximum value of the quiescent current substantially according to $$Iddq\_\max = Iddq\_nom * A * \exp(-B * Kp\_\max)$$

wherein Iddq_max is the maximum value of the quiescent current and Kp_max is substantially equal to the process derating factor plus a product of the process derating factor times the on-chip variation of the derating factor.

6. The method of claim 4 wherein step (c) comprises calculating the minimum value of the quiescent current substantially according to $$Iddq\_\min = Iddq\_nom * A * \exp(-B * Kp_{13} \min)$$

wherein Iddq_min is the minimum value of the quiescent current and Kp_max is substantially equal to the process derating factor minus a product of the process derating factor times the on-chip variation of the derating factor.

7. The method of claim 1 wherein the derating factor is a temperature derating factor and the curve fitting formula is a cubic function of the temperature derating factor.

8. The method of claim 1 wherein the derating factor is a voltage derating factor and the curve fitting formula is a linear function of the voltage derating factor.

9. The method of claim 1 wherein the derating factor is a voltage derating factor and the curve fitting formula is a quadratic function of the voltage derating factor.

10. A computer program product comprising:
a medium for embodying a computer program for input to a computer; and
a computer program embodied in the medium for causing the computer to perform steps of:
(a) receiving as input a value of a derating factor from a process monitor cell on an integrated circuit die and an on-chip variation of the derating factor;

(b) constructing a curve fitting formula for estimating a quiescent current of the integrated circuit die as a function of the derating factor;

(c) calculating minimum and maximum values of the quiescent current from the curve fitting formula, the value of the derating factor, and the on-chip variation of the derating factor to generate an estimate of minimum and maximum values for the quiescent current; and (d) generating as output the estimated minimum and maximum values of the quiescent current.

11. The computer program product of claim 10 wherein the derating factor is a process derating factor and the curve fitting formula is constructed as an exponential function substantially according to $$Iddq=Iddq\_nom*A*\exp(-B*Kp)$$

wherein Iddq is the quiescent current, A and B are calculated parameters, Iddq_nom is a nominal value of the quiescent current, and Kp is the process derating factor.

12. The computer program product of claim 11 wherein the parameter B is calculated substantially according to $$B=(\ln(Iddq\_\text{slow})-\ln(Iddq\_\text{fast}))/(Kp\_\text{fast}-Kp\_\text{slow})$$

wherein Iddq_slow is a quiescent current corresponding to a slow process, $Kp_{13}$ slow is a process derating factor corresponding to the slow process, Iddq_fast is a quiescent current corresponding to a fast process, and Kp_fast is a process derating factor corresponding to the fast process.

13. The computer program product of claim 12 wherein the parameter A is calculated substantially according to $$A=\exp(B).$$

14. The computer program product of claim 13 wherein step (c) comprises calculating the maximum value of the quiescent current substantially according to $$Iddq\_\text{max}=Iddq\_nom*A*\exp(-B*Kp\_\text{max})$$

wherein Iddq_max is the maximum value of the quiescent current and Kp_max is substantially equal to the process derating factor plus a product of the process derating factor times the on-chip variation of the derating factor.

15. The computer program product of claim 13 wherein step (c) comprises calculating the minimum value of the quiescent current substantially according to $$Iddq\_\text{min}=Iddq\_nom*A*\exp(-B*Kp\_\text{min})$$

wherein Iddq_min is the minimum value of the quiescent current and Kp_Max is substantially equal to the process derating factor minus a product of the process derating factor times the on-chip variation of the derating factor.

16. The computer program product of claim 10 wherein the derating factor is a temperature derating factor and the curve fitting formula is a cubic function of the temperature derating factor.

17. The computer program product of claim 10 wherein the derating factor is a voltage derating factor and the curve fitting formula is a linear function of the voltage derating factor.

18. The computer program product of claim 10 wherein the derating factor is a voltage derating factor and the curve fitting formula is a quadratic function of the voltage derating factor.

19. A computer program product comprising:

a medium for embodying a computer program for input to a computer; and a computer program embodied in the medium for causing the computer to perform steps of:

(a) receiving as input an integrated circuit design, values of quiescent current of each cell in the integrated circuit design for multiple process corners of a derating factor, a value of the derating factor from a process monitor cell, and an onchip variation of the derating factor;

(b) generating a design statistic file that includes a name and quantity of each cell in the integrated circuit design;

(c) constructing a curve fitting formula for the quiescent current of each cell named in the design statistic file as a function of the derating factor;

(d) calculating a minimum and a maximum value of the quiescent current for each cell named in the design statistic file from the curve fitting formula, from the value of the derating factor, and from the on-chip variation of the derating factor;

(e) multiplying the minimum and maximum values of quiescent current calculated for each cell named in the design statistic file by a corresponding quantity of the cell in the design statistic file to generate a minimum product and a maximum product respectively for the cell;

(f) summing the minimum product of each cell to generate an estimated minimum quiescent current of the integrated circuit design;

(g) summing the maximmn product of each cell to generate an estimated maximum quiescent current of the integrated circuit design; and (h) generating as output the estimated minimum and maximum values of quiescent current of the integrated circuit design as a function of the derating factor.

20. The computer program product of claim 19 wherein the derating factor is a process derating factor, and the curve fitting formula is an exponential function of the process derating factor.

21. The computer program product of claim 19 wherein the derating factor is a temperature derating factor, and the curve fitting formula is a cubic function of the temperature derating factor.

22. The computer program product of claim 19 wherein the derating factor is a voltage derating factor, and the curve fitting formula is a linear function of the voltage derating factor.

23. The computer program product of claim 19 wherein the derating factor is a voltage derating factor, and the curve fitting formula is a quadratic function of the voltage derating factor.

* * * * *